United States Patent
Au et al.

(10) Patent No.: US 6,225,785 B1
(45) Date of Patent: May 1, 2001

(54) ELECTRICAL SAFETY TEST APPARATUS AND TEST METHOD FOR RECHARGEABLE LITHIUM BATTERIES

(75) Inventors: George Wing Au, Fair Haven; Fee Chan Leung, Hazlet, both of NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/665,181

(22) Filed: Sep. 14, 2000

(51) Int. Cl.[7] .................................................. H02J 7/04
(52) U.S. Cl. ............................................. 320/147; 429/53
(58) Field of Search .............................. 320/147; 429/53

(56) References Cited

U.S. PATENT DOCUMENTS

| | | | | |
|---|---|---|---|---|
| 5,895,731 | * | 4/1999 | Clingempeel | 429/162 |
| 5,916,704 | * | 6/1999 | Lewin et al. | 429/54 |
| 6,074,775 | * | 6/2000 | Gartstein et al. | 429/53 |
| 6,163,131 | * | 12/2000 | Gartstein et al. | 320/118 |

* cited by examiner

*Primary Examiner*—Peter S. Wong
*Assistant Examiner*—Pia Tibbits
(74) *Attorney, Agent, or Firm*—Michael Zelenka; George B. Tereschuk

(57) ABSTRACT

A voltage is applied to a lithium battery resulting in a constant current charging rate until the lithium battery reaches two hundred and seventy percent of the minimum specified capacity, or until the lithium battery vents, or at a charging rate of three times the specified or rated minimum charging current for a predetermined minimum duration or time. The predetermined minimum duration of time is a function of the lithium battery's rated capacity and the rated or specified charging current. In one embodiment of the present invention, an increased voltage is utilized when testing a lithium battery having more than one cell. The present invention helps to detect lithium battery vents that may fail under use. The present invention is applicable to many military and specialized industrial applications where improper venting of the lithium batteries may result in failure and injury due to risk of fire or exposure of the lithium battery or cell.

11 Claims, 2 Drawing Sheets

ELECTRICAL SAFETY TEST APPARATUS AND TEST METHOD FOR RECHARGEABLE LITHIUM BATTERIES

GOVERNMENT INTEREST

The invention described herein may be manufactured, used, sold, imported, and licensed by or for the government of the United States of America without the payment to us of any royalty thereon.

FIELD OF THE INVENTION

The invention relates in general to safe use of lithium batteries, and more particularly to the testing of lithium battery vents.

BACKGROUND OF THE INVENTION

Lithium batteries, or batteries that contain metallic lithium, a lithium alloy, or a lithium ion, have relatively high energy and are used in many electrical devices. In many military and industrial applications, large and relatively high voltage rechargeable lithium batteries or cells are used. Many of these applications are critical. Therefore, the safety and operation of the lithium batteries is of vital importance. It is often desirable to test the battery design for overall performance and safety. One of the performance criteria is the ability of the battery or cell to release internal pressure without any violent venting. Generally, lithium batteries must be vented as a result of gases or pressure being formed due to the electrochemical reactions under certain load conditions and during charging. Testing procedures, such as Underwriter Laboratory Standards UL 1642, relating to the standard for safety for lithium batteries and abnormal charging tests have proven to be inadequate for many lithium batteries. Underwriter Laboratory standards call for subjecting the cell or battery to a 12-volt DC power supply, charging and overcharging the battery at a current rate three times the vendor's specification for a duration specified by the following formula:

Charging duration or time=$(2.5 \times C)/(3 \times I)$

Where,

C is the rated capacity of the cell, and

I is the batteries specified charging current.

The Underwiter Laboratory standards test methods are not sufficient to cause many rechargeable lithium batteries or cells to vent. Accordingly, these batteries would be determined safe according to the prior standards, when they may not be. Therefore, there is a need for a new testing procedure that will more adequately test the lithium battery or cell to ascertain the safety of the lithium battery or cell. Ascertaining the safety of the lithium battery or cell design is critical in view of the military and specialized industrial applications to which the lithium batteries or cells are placed. Any failure of a lithium battery, in addition to the failure of operation, may also result in a risk of fire or explosion of the lithium battery or cell. Therefore, it is critical that the lithium battery or cell be adequately tested, particularly the vent, and deemed safe prior to deployment or use. Accordingly, there is a need for an apparatus and test method to assure the safety of lithium batteries or cells.

SUMMARY OF THE INVENTION

The present invention comprises a method and apparatus for evaluating vent design and performance of lithium batteries or cells. A lithium battery or cell having a vent to be tested is subjected to a constant current at a charging rate until the cell or battery capacity reaches 270% of the battery or cell's rated capacity, or until the cell or battery vents, or at three times the battery's specified charging current for a specified predetermined minimum duration. The specified predetermined minimum duration is a function of the rated capacity of the cell and the battery or cell's specified charging current.

Accordingly, it is an object of the present invention to provide a safe lithium battery or cell.

It is a further object of the present invention to test or evaluate vent performance of a lithium battery or cell.

It is an advantage of the present invention that it is suitable for most lithium batteries or cells.

It is a further advantage of the present invention that it is relatively easy to set up and perform.

It is a feature of the present invention that a charging current is applied to the lithium battery or cell until the battery or cell capacity reaches 270% of the minimum rated capacity or until the cell vents.

It is another feature of the present invention that a charging current three times the battery or cell's specified charging current is applied for a minimum specified predetermined time or duration according to a formula.

These and other objects, advantages, and features will become readily apparent in view of the following detailed description.

DETAILED DESCRIPTION OF THE PREFERRED EMBODIMENTS

Figure 1:
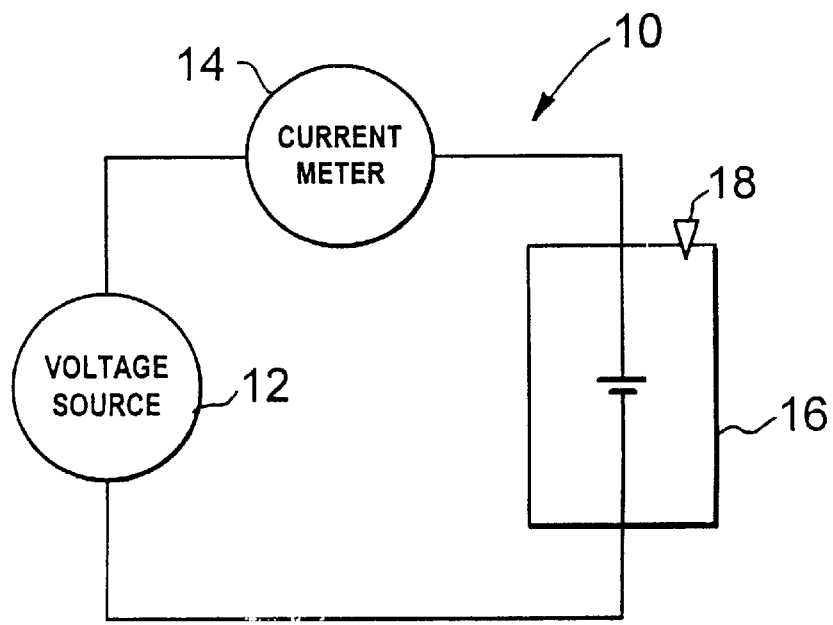
FIG. 1 schematically illustrates an embodiment of the present invention.

FIG. 1 schematically illustrates one embodiment of the apparatus of the present invention. In FIG. 1, a testing apparatus 10 is illustrated. A voltage source 12 is applied to a lithium battery. The lithium battery may be a metallic lithium, a lithium alloy, or a lithium ion battery having any number of electrochemical cells connected in series, parallel or both. An electrochemical cell converts chemical energy into electrical energy by an irreversible or reversible chemical reaction. The lithium battery 16 has a vent 18. The vent 18 is intended to release internal pressure formed within the lithium battery 16, which is caused by operation of the lithium battery 16. The vent 18 is designed to operate so as to avoid a violent release of pressure and a risk of fire or explosion of the lithium battery 16. Venting capabilities of the lithium battery are critical to proper operation of the lithium battery and safety of personnel using the lithium battery. A current meter 14 is used to measure the current applied to the lithium battery 16.

In operating the testing apparatus 10, voltage source 12 provides a voltage to battery 16. The voltage source 12 may provide, for example, a voltage of a minimum of thirteen and one-half volts DC. The applied voltage results in a current being applied to the battery 16. This current, as measured by current meter 14, provides a constant current at a charging rate. This current is applied until the battery 16 capacity reaches two hundred and seventy percent of the minimum rated capacity for the battery 16. In the alternative, the constant current is applied until the battery 16 is caused to vent through vent 18. In another alternative, the constant current of a value of three times the battery's 16 specified charging current is applied for a minimum duration determined by the following formula:

Minimum duration or charging time=$(8.1 \times C)/(3 \times I)$

Where,

C is the rated capacity of the cell, and

I is the battery's specified charging current.

Generally, if the rated capacity of the battery or cell is in Ampere hours, then the minimum duration will be in units of hours.

Figure 2:
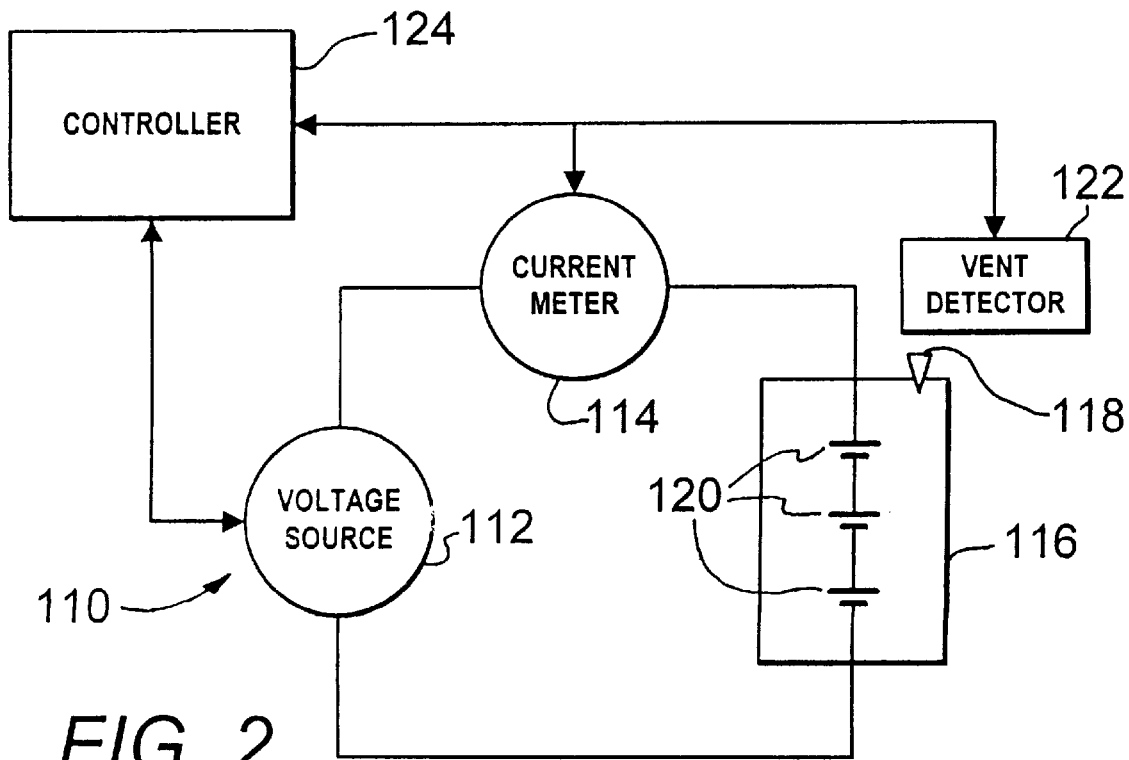
FIG. 2 schematically illustrates another embodiment of the present invention.

FIG. 2 schematically illustrates another embodiment of the apparatus of the present invention, In this embodiment, testing apparatus 110 may be used to test a lithium battery having multiple cells. Voltage source 112 applies a voltage to a Lithium battery 116. Lithium battery 116 may be comprised of a multitude or a plurality of different cells 120. Accordingly, the number of cells may be placed in series to provide a higher voltage than possible with a single cell battery. The voltage source 112 is capable of applying a voltage sufficient to provide the required charging current to the lithium battery 116. For example, voltage source 112 may provide a voltage of thirteen and one-half volts DC multiplied by the number of cells 120 in lithium battery 116, if the cells 120 are twelve volt cells. Current meter 114 measures the current provided to the lithium battery 116. Lithium battery 116 has a vent 118. The vent 118 is monitored by vent detector 122. A controller 124 is coupled to the voltage source 112, the current meter 114 and the vent detector 122. The controller 124 monitors and controls the operation of the testing apparatus 110.

The operation of the embodiment illustrated in FIG. 2 is similar to the operation of the embodiment illustrated in FIG. 1. Voltage source 112 provides any voltage to the battery 116 for providing a minimum constant current at a charging rate until the battery 116 capacity reaches 270% of the specified minimum capacity for the lithium battery 116. In the alternative, the voltage source 112 provides a current until the lithium battery 116 is caused to vent through vent 118. In another alternative, the voltage source 112 provides a current three times the lithium battery's 116 specified charging current for a minimum duration according to the following formula:

Minimum duration or charge time=$(8.1 \times C)/(3 \times I)$

Where,

C is the rated capacity of the cell, and

I is the battery's specified charging current.

The controller 124 causes the voltage source 112 to provide a voltage so as to result in a current. Upon reaching any of the alternative predetermined conditions indicated above, the controller will reduce or disconnect the voltage source and provide data on the results of the testing procedure.

The embodiment illustrated in FIG. 2 is particularly well suited to deal with multiple cell batteries commonly found in industrial and military applications. This embodiment provides for the testing of lithium batteries having higher voltages. Generally, commercial practice does not design or utilize rechargeable lithium batteries in excess of twelve volts DC to minimize the electrical circuit design required to monitor individual cells to insure cell balance.

Figure 3:
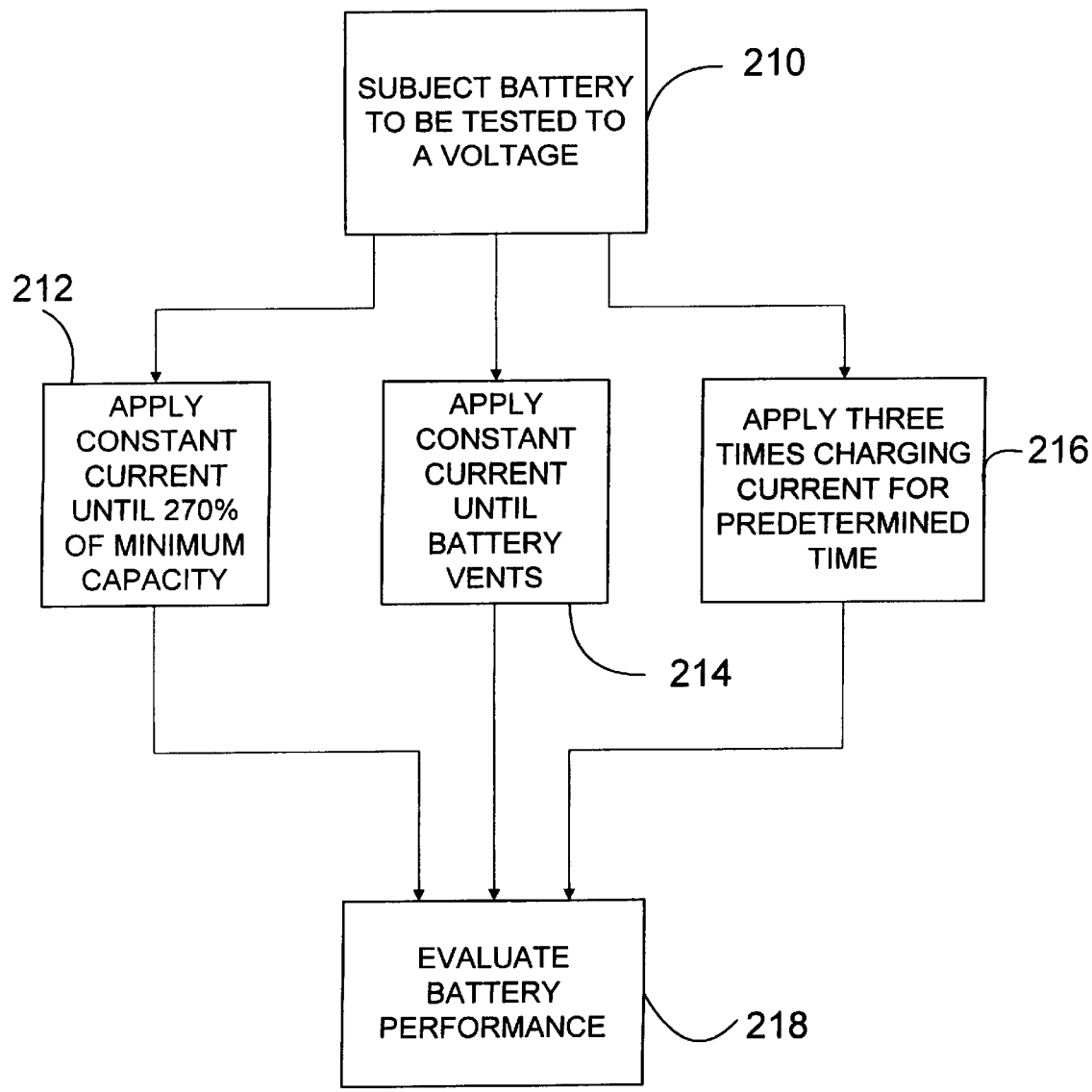
FIG. 3 is a block diagram illustrating the acts or method steps of the present invention.

FIG. 3 is a block diagram representing or illustrating the method steps, or acts of the present invention. Box 210 represents the step or act of subjecting a lithium battery to be tested to a voltage. Box 212 represents the step or act of applying a constant current, as a result of the applied voltage, until the lithium battery reaches two hundred and seventy percent of its minimum capacity. Box 214 represents the step or act of applying a constant current to the lithium battery until the lithium battery vents. Box 216 represents the step or act of applying three times the rated or specified charging current of the lithium battery for a predetermined time or duration. The predetermined time or duration is obtained or calculated based on the following formula:

Minimum duration or charge time=$(8.1 \times C)/(3 \times I)$

Where,

C is the rated capacity of the cell, and

I is the battery's specified charging current.

Box 218 represents the step or act of evaluating battery performance based on the result of applying the current as indicated in boxes 212, 214 or 216. The battery performance is indicated by whether or not the lithium battery or cell is caused to vent, in an abnormal way, as a result of the applied current. The steps or acts represented by boxes 212, 214, and 216 represent alternative steps or acts. Therefore, any one of the steps or acts represented by boxes 212, 214, and 216 may be applied to the battery at one time.

The present invention provides an apparatus and testing method for testing lithium batteries and their vent design that is more reliable than prior testing standards or methods. The practicing of the present invention is beneficial to many military and industrial applications where the use of relatively high voltage lithium batteries and their proper performance is critical. The present invention results in detection of potentially dangerous lithium batteries that otherwise would go undetected by prior procedures or standards. Therefore, the present invention advances the art of lithium battery testing and greatly increases the confidence and reliability of lithium batteries once deployed or utilized.

Although the preferred embodiments have been illustrated and described, it will be obvious to those skilled in the art that various modifications may be made without departing from the spirit and scope of this invention.

What is claimed is:

1. A method of testing a vent in a lithium battery comprising the steps of:

subjecting the battery to be tested to a voltage;

applying to the lithium battery a charging current sufficient to establish vent performance; and evaluating battery performance.

2. A method of testing a vent in a lithium battery as in claim 1 wherein:

said step of applying to the lithium battery a charging current comprises applying a constant current to the lithium battery until two hundred and seventy percent of a predetermined minimum capacity of the lithium battery is reached.

3. A method of testing a vent in a lithium battery as in claim 1 wherein:

said step of applying to the lithium battery a charging current comprises applying a constant current until the lithium battery vents.

4. A method of testing a vent in a lithium battery as in claim 1 wherein:

said step of applying to the lithium battery a charging current comprises applying a charging current equal to three times the lithium battery's specified or rated charging current for a minimum duration determined by the following formula, $$\text{the minimum duration} = (8.1 \times C)/(3 \times I)$$

where,

C is the rated capacity of the cell, and

I is the battery's specified charging current.

5. A method of testing a vent in a lithium battery comprising the step of:

applying a current to the lithium battery selected from the group consisting of applying a constant current until one hundred and seventy percent of a minimum capacity of the lithium battery is reached, applying a constant current until the lithium battery vents, or applying a current three times the lithium battery's specified charging current for a minimum duration determined by the following formula, $$\text{the minimum duration} = (8.1 \times C)/(3 \times I)$$

where,

C is the rated capacity of the cell, and

I is the lithium battery's specified charging current.

6. An apparatus for testing a lithium battery having a specified charging current comprising:

a means, coupled to the lithium battery, for applying a current to the lithium battery substantially equal to three times the lithium battery's specified charging current;

a means, coupled to said means for applying a current, for controlling the means for applying the current for a minimum duration determined by the following formula, $$\text{the minimum duration} = (8.1 \times C)/(3 \times I)$$

where,

C is the rated capacity of the lithium battery, and

I is the lithium battery's specified charging current, whereby the current sufficient to determine the effectiveness of a vent of the lithium battery is applied to the lithium battery.

7. An apparatus for testing a lithium battery as in claim 6 further comprising:

a means, coupled to said controller means, for detecting venting of the battery.

8. An apparatus for testing a lithium battery as in claim 6 wherein:

said means for applying a current comprises a voltage source.

9. An apparatus for testing a lithium battery as in claim 8 wherein:

said voltage source provides at least thirteen and one-half volts.

10. An apparatus for testing a lithium battery as in claim 8 wherein:

said voltage source provides a voltage at least as high as thirteen and one-half volts multiplied by a number of cells in the lithium battery.

11. An apparatus for testing a lithium battery having a vent and a plurality of cells, each cell having a predetermined voltage comprising:

a voltage source, said voltage source capable of providing a voltage to the lithium battery greater than the predetermined voltage multiplied by the number of said plurality of cells;

a controller coupled to said voltage source, said controller controlling the application of a charging current so as to provide the charging current for a predetermined minimum duration substantially determined by the following formula, $$\text{the predetermined miniumum duration} = (8.1 \times C)/(3 \times I)$$

where,

C is the rated capacity of the lithium battery, and

I is the lithium battery's specified charging current, whereby the charging current sufficient to determine the effectiveness of a vent of the lithium battery is applied to the lithium battery.

* * * * *